(12) United States Patent
Cao et al.

(10) Patent No.: US 8,940,650 B2
(45) Date of Patent: Jan. 27, 2015

(54) METHODS FOR FABRICATING INTEGRATED CIRCUITS UTILIZING SILICON NITRIDE LAYERS

(71) Applicant: GLOBALFOUNDRIES, Inc., Grand Cayman (KY)

(72) Inventors: Huy Cao, Rexford, NY (US); Huang Liu, Mechanicville, NY (US); Hoong Shing Wong, Clifton Park, NY (US); Songkram Srivathanakul, Waterford, NY (US); Sandeep Gaan, Malta, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 49 days.

(21) Appl. No.: 13/787,521

(22) Filed: Mar. 6, 2013

(65) Prior Publication Data

US 2014/0256141 A1  Sep. 11, 2014

(51) Int. Cl.
*H01L 21/31* (2006.01)
*H01L 21/02* (2006.01)

(52) U.S. Cl.
CPC ............... *H01L 21/02266* (2013.01)
USPC ........................................ 438/792; 438/695

(58) Field of Classification Search
USPC ............ 438/792, 791, 694, 695, 696
See application file for complete search history.

(56) References Cited

U.S. PATENT DOCUMENTS

| | | | |
|---|---|---|---|
| 6,017,614 A * | 1/2000 | Tsai et al. ...................... | 428/209 |
| 6,365,521 B1 * | 4/2002 | Shubert et al. ................ | 438/691 |
| 7,482,247 B1 * | 1/2009 | Papasouliotis et al. ........ | 438/437 |
| 2011/0076476 A1 * | 3/2011 | Chouquet et al. ............. | 428/216 |

* cited by examiner

*Primary Examiner* — Reema Patel
(74) *Attorney, Agent, or Firm* — Ingrassia Fisher & Lorenz, P.C.

(57) ABSTRACT

A method of fabricating an integrated circuit includes the steps of providing a semiconductor substrate comprising a semiconductor device disposed thereon and depositing a first silicon nitride layer over the semiconductor substrate and over the semiconductor device using a first deposition process. The first deposition process is a plasma-enhanced chemical vapor deposition (PECVD) process that operates over a plurality of cycles, each cycle having a first time interval and a second time interval. The PECVD process includes the steps of generating a plasma with a power source during the first time interval, the plasma comprising reactive ionic and radical species of a silicon-providing gas and a nitrogen-providing gas, and discontinuing generating the plasma during the second time interval immediately subsequent to the first time interval. The method further includes depositing a second silicon nitride layer over the first silicon nitride layer after the plurality of cycles.

19 Claims, 5 Drawing Sheets

METHODS FOR FABRICATING INTEGRATED CIRCUITS UTILIZING SILICON NITRIDE LAYERS

TECHNICAL FIELD

Embodiments of the present disclosure are generally directed to methods for fabricating integrated circuits. More particularly, embodiments of the present disclosure are directed to methods for fabricating integrated circuits using silicon nitride layers.

BACKGROUND

For the fabrication of semiconductor integrated circuits, semiconductor devices are integrated and laid out in a small area of a chip, thus requiring the devices to be placed in close proximity to each other. The continued decrease in the dimensions and spacing of devices on integrated circuits requires various material layers to be deposited on the integrated circuits to electrically isolate various active components, such as transistors, resistors, and capacitors. With the inclusion of high aspect ratio features, that is, features whose height is relatively large as compared to their surface area on the chip, it becomes much more difficult to deposit isolation layers using the standard techniques currently known in the art. For example, one difficulty encountered in the deposition of isolation layers over high aspect ratio features is the formation of "voids" or "seams," which are empty spaces between the features and the isolation layer.

One material used to form isolation layers that has proved particularly difficult to deposit over high aspect ratio features (without forming voids or seams) is silicon nitride ($Si_xN_y$). Silicon nitride films are desirable as isolation layers because they exhibit excellent oxidation resistance and electrical insulating characteristics.

With the increased use of high aspect ratio features in the design of integrated circuits, there has arisen a need for methods for depositing silicon nitride films having good coverage over features having high aspect ratios, as well as films having a thin, uniform thickness. However, using conventional techniques, such as are described below, it has proven difficult to form a thin film having good coverage on substantially the entire surface of a structure having a high aspect ratio.

For example, in certain instances, conventional plasma enhanced chemical vapor deposition (PECVD) methods may be used for depositing a silicon nitride film on a semiconductor substrate. These conventional PECVD methods may include supplying a silicon source gas, e.g., silane, and a nitrogen source gas, e.g., nitrogen ($N_2$) gas or ammonia ($NH_3$) gas, simultaneously to a reactor in which a substrate is processed while applying radio frequency (RF) power to the reactor.

While the plasma enhanced chemical vapor deposition methods allow for deposition at a relatively low temperature with a relatively high deposition rate, silicon nitride films deposited by PECVD typically have defects, such as a high hydrogen concentration, low thermal stability, and low step coverage (i.e., poor coverage over high aspect ratio features, which undesirably leads to void and seam formation).

In another example, low pressure chemical vapor deposition (LPCVD) methods may be used for depositing a silicon nitride film. LPCVD methods may include supplying a silicon source gas, e.g., dichlorosilane (DCS), bis-tert-butylaminosilane (BTBAS), or hexachlorodisilane (HCDS), and a nitrogen source gas, e.g., ammonia ($NH_3$) gas, simultaneously to a reactor in which a substrate is processed. The LPCVD process can be performed at a relatively low pressure of about 10 Pa to about 700 Pa and at a relatively high temperature of about 800° C. to about 900° C.

In performing low pressure chemical vapor deposition (LPCVD) in a deposition apparatus, undesirable by-products such as ammonium chloride ($NH_4Cl_4$) may be formed by a reaction between the silicon source gas and ammonia gas. Such by-products may be accumulated in the exhaust system of the deposition apparatus, leading to environmental concerns. In addition, the deposition rate using LPCVD is relatively very low, which prohibits a high throughput. Furthermore, the deposition is performed at a relatively high temperature, and thus interface oxidation (between the device and the isolation layer) may occur. Such oxidation may cause current leakage when the film is used as an insulation layer.

Accordingly, it is desirable to provide silicon nitride deposition techniques that are capable of conformal deposition over high aspect ratio features. Further, it is desirable to provide such techniques that have a relatively rapid throughput. Still further, other desirable features and characteristics of the inventive subject matter will become apparent from the subsequent detailed description of the inventive subject matter and the appended claims, taken in conjunction with the accompanying drawings and this background of the disclosure.

BRIEF SUMMARY

Methods for depositing silicon nitride layers onto semiconductor substrates in the fabrication of integrated circuits are disclosed. In one embodiment, a method of fabricating an integrated circuit includes the steps of providing a semiconductor substrate comprising a semiconductor device disposed thereon and depositing a first silicon nitride layer over the semiconductor substrate and over the semiconductor device using a first deposition process. The first deposition process is a plasma-enhanced chemical vapor deposition (PECVD) process that operates over a plurality of cycles, each cycle having a first time interval and a second time interval. The PECVD process includes the steps of generating a plasma with a power source during the first time interval, the plasma comprising reactive ionic and radical species of a silicon-providing gas and a nitrogen-providing gas, and discontinuing generating the plasma during the second time interval immediately subsequent to the first time interval. The method further includes depositing a second silicon nitride layer over the first silicon nitride layer after the plurality of cycles.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, and wherein:

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Figure 1:
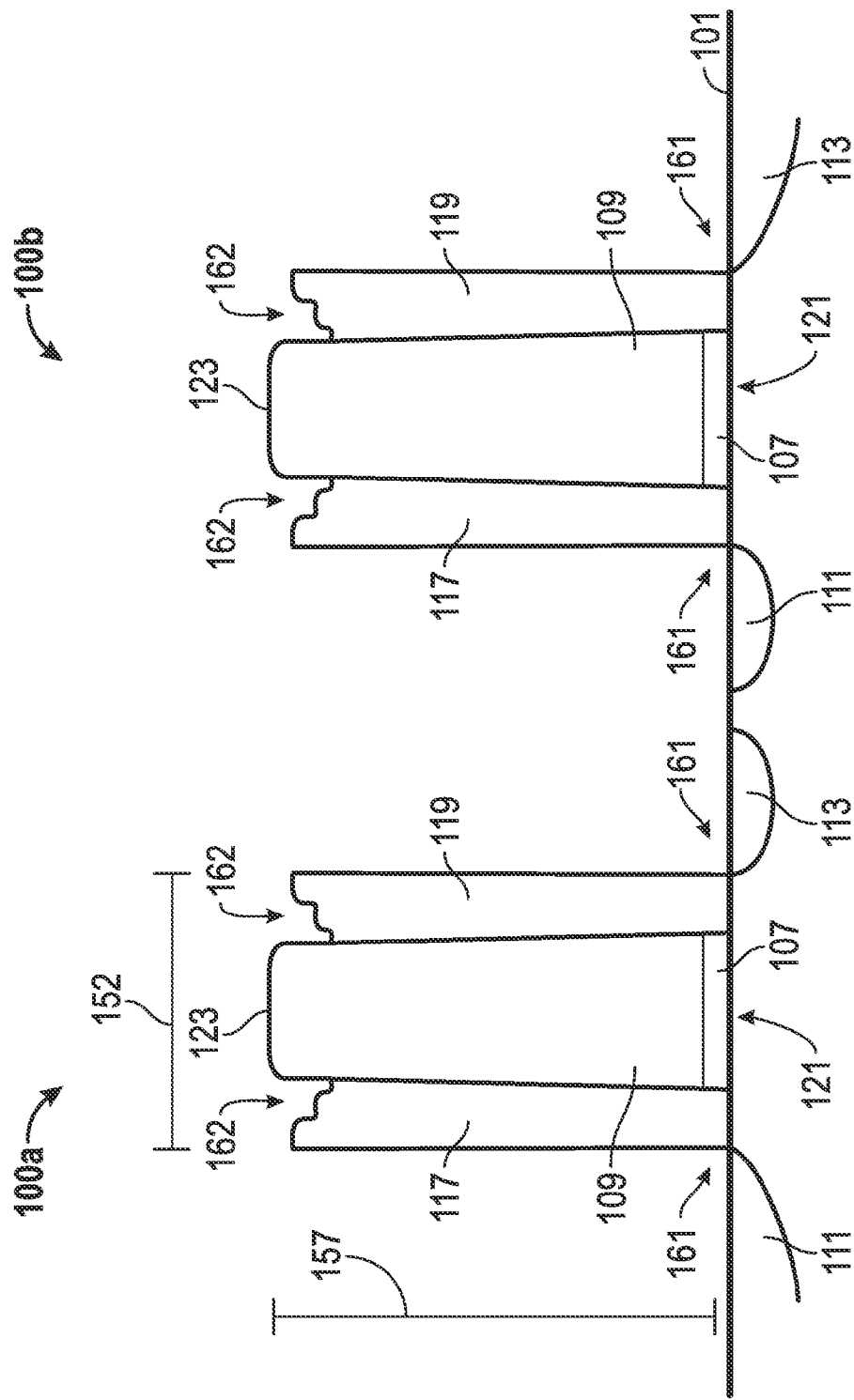
FIGS. 1-3 are cross-sectional views illustrating methods for fabricating a semiconductor device structure in accordance with an exemplary embodiment.
Figure 2:
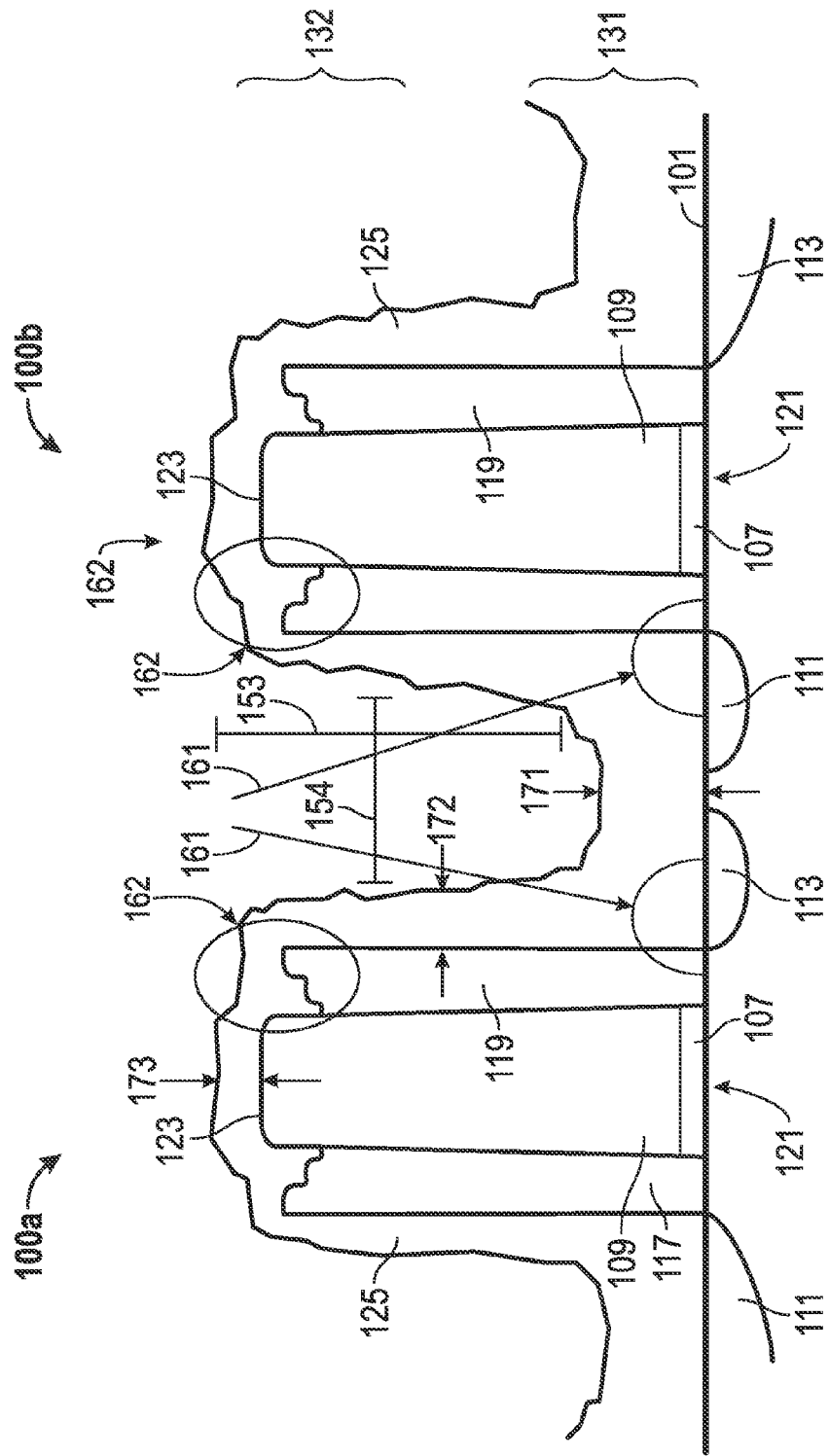
Figure 3:
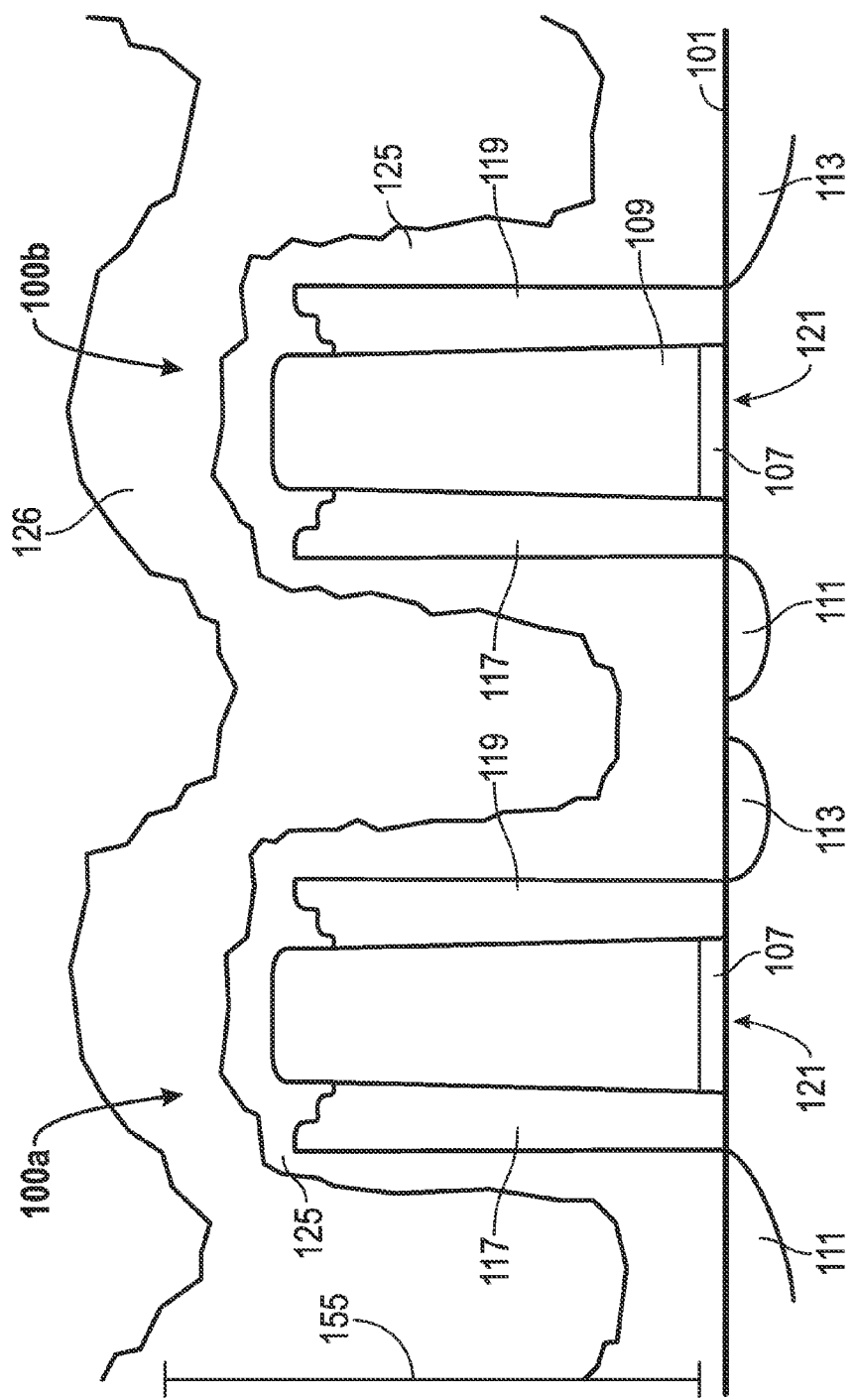

FIGS. 1-3 illustrate a metal oxide semiconductor (MOS) device structure and related process steps for fabricating the MOS device structure employing silicon nitride isolation between the individual semiconductive device structures disposed thereon. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the fabrication of MOS semiconductor devices are well-known in the art and so, in the interest of brevity, many conventional steps will only be mentioned briefly herein or will be omitted entirely without providing the well-known process details.

With reference now particularly to FIG. 1, a semiconductor substrate 101 is provided that may be formed of, for example, a bulk silicon wafer or a silicon-on-insulator (SOI) substrate. Two individual device structures 100a and 100b are shown formed on the substrate 101; however, it will be appreciated that a typical integrated circuit may include any number of such device structures. Further, the term "semiconductor device" as used herein is intended to refer to any semiconductive device as may be provided on an integrated circuit, such as a capacitor, a transistor, a resistor, etc., as are known in the art. Each structure 100a, 100b is formed as follows: A gate dielectric layer 107 is formed on the surface of the semiconductor substrate 101. The gate dielectric layer 107 may include, for example, an oxide layer formed by thermal oxidation or by deposition of an oxide on the semiconductor substrate. The gate dielectric layer 107 may have a thickness of from about 5 Å to about 30 Å. The gate dielectric layer 107 may alternatively include a metal oxide such as $HfO_2$ or $ZrO_2$. A gate electrode 109 is then formed on the gate dielectric layer 107. The gate electrode 109 has a thickness of about 750 Å to about 3,500 Å. The gate electrode 109 may be formed by blanket deposition of a layer of Si, SiGe, or polysilicon, which is then appropriately patterned utilizing photolithographic techniques as are known in the art.

Each device structure 100a, 100b is provided with accompanying source regions 111 and drain regions 113 in portions of the semiconductor substrate 101 adjacent thereto. Further, as shown in FIG. 1, spacer structures 117, 119 are formed on opposing sides of the gate electrode 109. The spacer structures 117, 119 cover the sides of the gate electrode 109 and also cover a portion of the surface of the substrate 101 adjacent to the gate electrode 109 After the gate electrodes 109 are patterned and etched, the spacer structures 117, 119 are formed by depositing a spacer-forming material, either an oxide or a nitride, over lying the gate electrode 109. The spacer-forming material is anisotropically etched to form the spacer structures 117, 119 about the sidewalls of the gate electrode 109 and the gate dielectric 107. Thereafter, the source regions 111 and drain regions 113 are formed by using the gate electrode 109 and the spacer structures 117, 119 as an ion implantation mask. A channel region 121 is defined between the source regions 111 and the drain regions 113.

As shown in FIG. 1, the semiconductor device includes several features where, upon deposition of an isolation layer (such as silicon nitride) thereon, voids or seams are likely to form using convention deposition techniques. For example, the illustrated devices 100a, 100b formed on the semiconductor substrate 101 have a relatively high aspect ratio. That is, a ratio of the height 151 of the devices 100a, 100b to the width 152 of the devices 100a, 100b is relatively large as compared to semiconductor devices previously known in the art. For example, in one embodiment, the aspect ratio may be about 1.0 or greater. In the context of integrated circuits with small-scale half-pitches (i.e., half the distances between identical features on the integrated circuit), for example, devices having half-pitches of 22 nm, 14 nm, or smaller, the result of this high aspect ratio is that it is difficult to completely fill the corner regions 161 that are present at the intersection of the sidewall spacers 117, 119 and the surface of the substrate 101. Voids have thus been previously observed in these corner regions 161. Further, the illustrated devices 100a, 100b formed on the semiconductor substrate have irregular regions 162 along the upper surfaces 123 of the devices that are formed as a result of differential etching rates between the gate electrode 109 and the sidewall spacers 117, 119 during the above-described fabrication steps of such devices 100a, 100b. These irregular upper surface regions 162, due to the locally high aspect ratios of such regions, have also been observed to be difficult to completely cover/fill without the formation of seams or voids.

As noted above, it is desirable to provide electrical isolation between semiconductor devices, such as devices 100a, 100b shown in FIG. 1. Often, a layer of silicon nitride is employed for this purpose. In some examples known in the art, conventional PECVD techniques are employed to deposit the silicon nitride layer over and between the devices. PECVD uses electrical energy to generate a "glow discharge" (i.e., a plasma) in which the energy therefrom is transferred to a gas mixture. This transferred energy transforms the gas mixture into reactive radicals and ions, and other highly excited gaseous species. These atomic and molecular fragments interact with the substrate and, depending on the nature of these interactions, either etching or deposition processes occur at the substrate.

The plasma is typically created by radio frequency (RF) or direct current (DC) discharge between two electrodes, the space between which is filled with the reacting gaseous species. A simple (DC) discharge can be readily created at a few hundred Pa (i.e., about 100 to about 300 Pa) between two conductive electrodes, and may be suitable for deposition of conductive materials. However, insulating films will quickly extinguish this discharge as they are deposited. Thus, it is more common to excite a capacitive discharge by applying an alternating-current (AC) or radio-frequency signal between an electrode and the conductive walls of a reactor chamber, or between two cylindrical conductive electrodes facing one another, especially where isolation materials are to be deposited. Frequencies of a few tens of Hz to a few thousand Hz will produce time-varying plasmas that are repeatedly initiated and extinguished; frequencies of tens of kilohertz to tens of megahertz result in reasonably time-independent discharges.

Excitation frequencies in the low-frequency (LF) range, usually around 100 kHz, require several hundred volts to sustain the discharge. These large voltages lead to high-energy ion bombardment of the substrate surface. High-frequency plasmas are often excited at the standard 13.56 MHz frequency widely available for industrial use; at high frequencies, a greater degree of ionization is achieved, and thus lower voltages are sufficient to produce higher plasma densities.

Thus, using different frequencies to generate the plasma, it is possible to adjust the chemistry and radical/ionic bombardment in the deposition by changing the frequency of excitation, or by using a mixture of low- and high-frequency signals in a dual-frequency reactor. As such, it is possible to control the degree to which etching and/or deposition occurs at the surface of the substrate.

Figure 4:
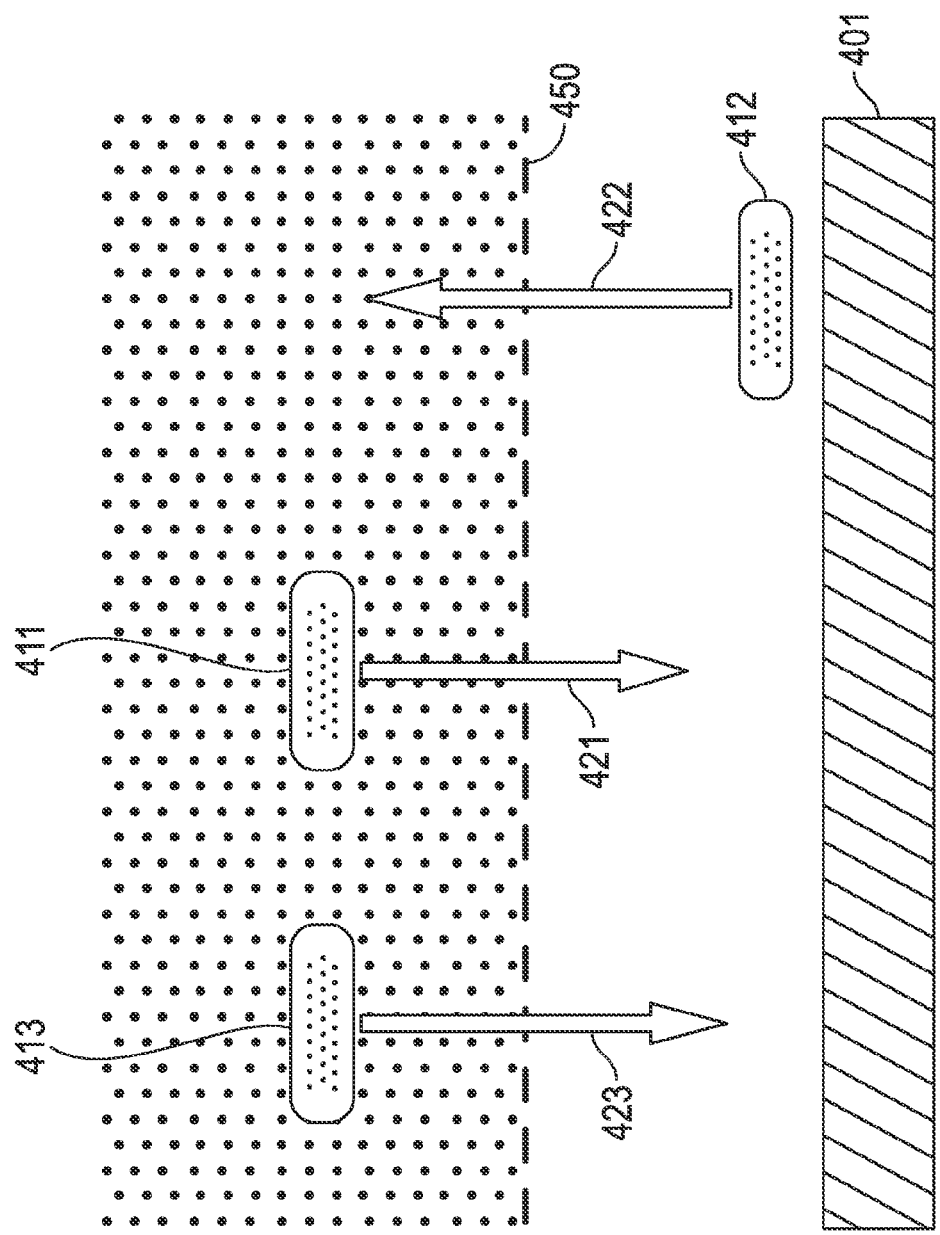
FIG. 4 illustrates the chemical and physical interactions that occur on a semiconductor device substrate during a plasma-enhanced chemical vapor deposition process performed on such substrate.

FIG. 4 presents a graphical illustration of the PECVD process. Upon excitation of the gaseous species with the RF discharge, some of the gaseous species are ionized into radical/ionic species 411. Some of the radical/ionic species 411 are accelerated downward through a boundary layer 450 (i.e., the layer of increasing gas flow velocity above the substrate 401) and toward the substrate 401, as indicated by arrow 421. At the substrate 401, the radical/ionic species 411 bombard the substrate 401 and are either absorbed thereon (deposition) or cause dissociation of surface molecules on the substrate 401 (etching). With particular regard to the etching process, some of the absorbed radical/ionic species 411 undergo a chemical reaction to form reaction by-products 412 at the substrate 401 surface, and then desorb from the surface of the substrate 401, as indicated by arrow 422, in a process known as chemical "sputtering". Some of the gaseous species are not ionized and remain neutral species 413. Some of these neutral species diffuse downward toward the substrate 401, as indicated by arrow 423, where they may interact with the substrate 401, resulting in deposition.

The deposition of the gaseous species onto the substrate 401 by PECVD can either be surface-reaction rate limited or mass-transport rate limited. Surface reactions control the deposition rate when growth occurs at low temperatures (where the reaction occurs slowly) and also dominate at low pressures (where the boundary layer is thin and reactants easily diffuse to the surface). Under these conditions, since the reactants easily diffuse through the boundary layer 450, the amount of reactant at the surface of the substrate 401 is independent of reactor pressure. Therefore, it is the reactions of the precursors adsorbed on the surface which will determine the overall growth rate of the film. Surface-reaction limited deposition is also achieved where the amount of radical/ionic species is maintained at a low level. With fewer radical/ionic species to react at the surface, the deposition is limited by the reaction at the surface of the substrate 401 and not by the speed at which the radical/ionic species are able to traverse the boundary layer 450.

A deposition limited by mass transport is controlled by the diffusion of reactants through the boundary layer 450 and the diffusion of reaction by-products 412 out of the boundary layer. Mass transport limits reactions when the temperature and pressure are high. These conditions increase the thickness of the boundary layer 450 and make it harder for gases to diffuse through. In addition, decomposition of the reactants is typically quicker since the substrate is at a higher temperature.

As noted above, embodiments of the present disclosure are directed to film deposition techniques, particularly silicon nitride film deposition techniques, that are capable of conformal deposition over high aspect ratio features. The embodiments are further directed to such techniques that have a relatively rapid throughput. While conventional PECVD processes are able to deposit silicon nitride with a relatively rapid throughput, conventional PECVD process are susceptible to the formation of voids and seams when employed on substrates including high aspect ratio features. As such, the embodiments presented herein are directed to novel methods for performing PECVD so as to avoid the formation of voids and seams.

Reference is now made to FIG. 2, which illustrates the semiconductor substrate described above with regard to FIG. 1 having a first silicon nitride layer 125 formed thereon in accordance with an exemplary embodiment. As shown in FIG. 2, the first silicon nitride layer 125 is formed such that the corner regions 161 and the irregular upper surface regions 162 are completely filled by the first silicon nitride layer 125 without any seams or voids formed therein. Further, as additionally shown in FIG. 2, the first silicon nitride layer 125 has varying thicknesses about the devices, that is, from the surface of the substrate 101 between devices 100a, 100b, to the spacer structures 117, 119 of the devices to the upper surface 123 of the devices. Particularly, the first silicon nitride layer 125 has a first thickness 171 in the region between the devices 100a, 100b and above the substrate 101. The first silicon layer 125 has a second thickness 172 in the region along the spacer structures 117, 119 of the devices 100a, 100b, the second thickness 172 being less than the first thickness 171. Further, the first silicon nitride layer 125 has a third thickness 173 on the upper surface 123 of the formed devices 100a, 100b, the third thickness 173 being less than the second thickness 172.

Referring now to the manner of operation of the PECVD process so as to form a first silicon nitride layer 125 as shown in FIG. 2, in one embodiment, the PECVD process is performed in a manner so as to produce a sufficiently low amount of radical/ionic species such that the PECVD process is surface-reaction rate limited but is not mass-transport rate limited. In this manner, the PECVD process is able to create substantially equal amounts of deposition in lower regions 131 of the semiconductor devices (for example, regions near the bottom of high aspect ratio devices 100a, 100b formed on the substrate 101) and in upper regions 132 of the semiconductor devices (for example, regions above and near the top of high aspect ratio devices 100a, 100b formed on the substrate 101). That is, by controlling the speed of the deposition at the surface, it is irrelevant how far the radical/ionic species must travel to reach the surface. Thus, the deposited layer 125 forms at the same rate regardless of the distance that the radical/ionic species travel.

This manner of deposition is achieved, in one embodiment, by operating the PECVD process in a cyclic manner such that, during the first part of the work cycle, radical/ionic species are generated by the plasma and by particle bombardment of the substrate surface, while during second part of the work cycle the created radical/ionic species are used to react with the precursor elements to produce a deposited film, thereby allowing chemical reactions on the semiconductor device surfaces to proceed uninhibited by the etching that may result from bombardment with radical/ionic species. The operation of the PECVD process cycles back and forth between radical generation and surface reaction during successive first and second intervals. In one embodiment, the first intervals occur for about 25% to about 75% of the total time of operation of the PECVD process, for example for about 40% to about 60% of the total time of operation, such as about 50% of the total time of operation. The second intervals occur during the balance of the time of operation of the PECVD process.

Further, the above-described manner of operation is achieved by providing a ratio of gas flow wherein the silicon-providing components (e.g., silane) are relatively low as compared to the nitrogen-providing components (e.g., diatomic nitrogen or ammonia). This low $Si_x:N_y$ ratio has been discovered to promote relatively equal reaction/deposition rates taking place across all regions of the semiconductor device.

As previously noted, the thickness of the first silicon nitride layer 125 varies between higher 132 and lower regions 131 of the semiconductor device. As will be appreciated, this varying thickness is not achieved solely as a result of a constant reaction rate along all regions of the substrate during the PECVD process. Rather, in a second mechanism of action, the disclosed PECVD process, during the first intervals wherein reactive/ionic species are formed, etching or "sputtering" occurs at the deposited silicon nitride layer 125. As noted above, chemical sputtering results where reactive species bombard the surface of the device, chemically reacts therewith, and subsequently dissociates. Due to the high pressures at which PECVD is typically operated, the mean free path of travel for the gaseous species (particularly the radical/ionic species) is very short, which results in a higher rate of bombardment of the surface atoms at the upper regions 132 of the semiconductor device (which results in chemical sputtering as noted above) and, consequently, a lower rate of bombardment of the surface atoms at the lower regions 131. As such, during the radical/ionic species generation (first) intervals, the upper regions 132 are "etched" (via chemical sputtering) at a higher rate than the lower regions 131, while, during the surface reaction (second) intervals during which radical/ionic species are formed, deposition occurs at a substantially constant rate at all locations on the semiconductor device. The result of such cyclic operation is, as noted above, varying thicknesses of the silicon nitride layer 125 wherein the layer is thicker in the lower regions 131 and thinner in the upper regions 132 (e.g., thicknesses 171 and 173, respectively, with thickness 172 along the sidewalls 117, 119 being of intermediate thickness).

Figure 5:
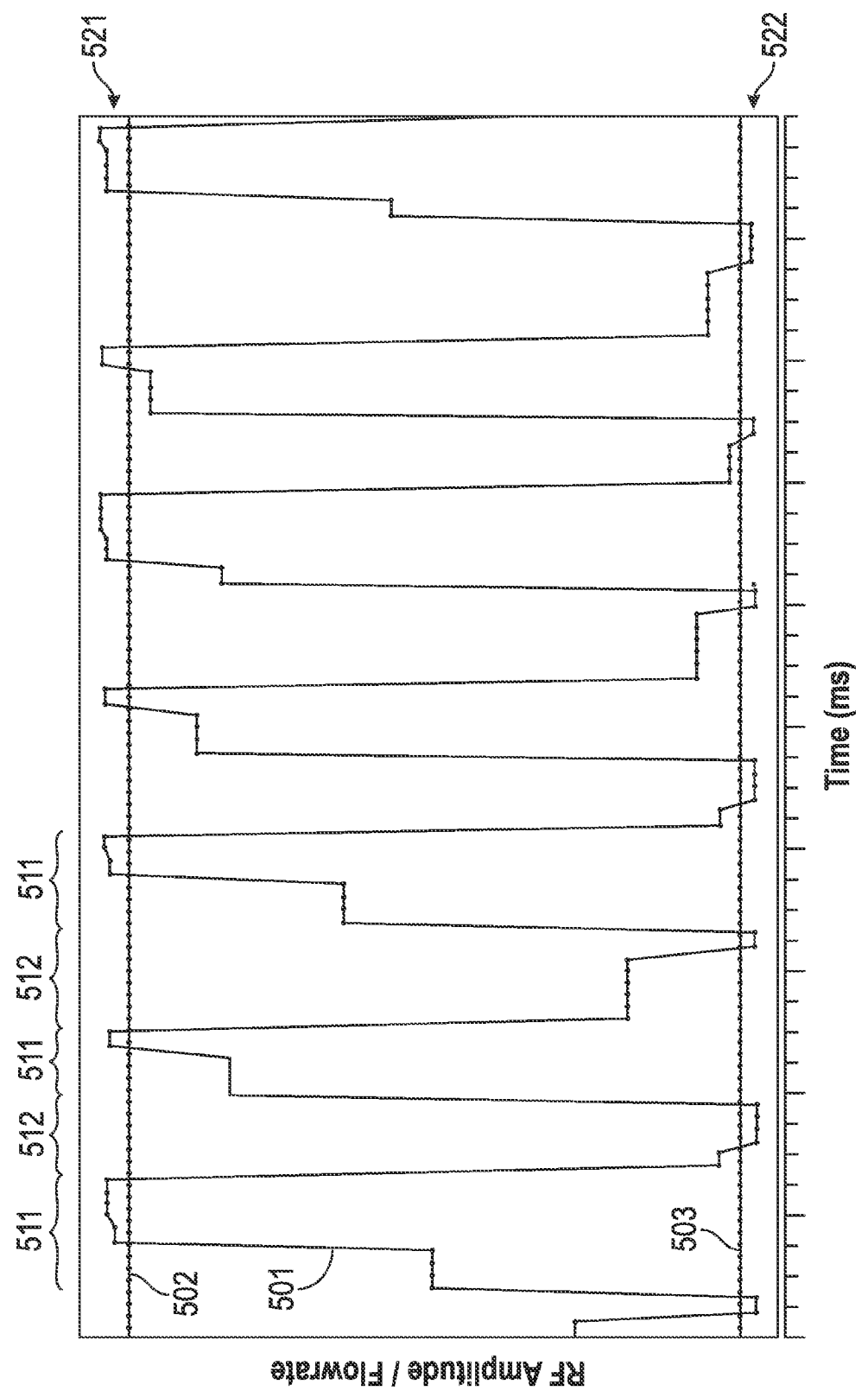
FIG. 5 is a plot illustrating radio frequency intervals at gas flow rates used during a plasma-enhanced chemical vapor deposition process in accordance with an exemplary embodiment.

The cyclic nature of the operation of the PECVD process in accordance with the present disclosure is illustrated in FIG. 5. As shown therein, the RF signal 501 cycles repeatedly between a maximum RF power amplitude value 521 and a minimum RF power amplitude value 522 over time (in milliseconds along the horizontal axis). The first interval 511 is defined by the time period that depends of the frequency setting of the work cycles. For example, for a frequency of 500 hz, then each work cycle is 1/500=0.002 second per work cycle. Depending on the desired properties of the silicon nitride layer, the frequency may be provided from about 100 hz to about 1000 hz. As such, in an embodiment, the work cycle may last from about 0.001 second to about 0.01 second (each interval therefor being about 0.0005 second to about 0.005 second). During the first half of such cycle, or 0.001 second in the given example, the RF signal approaches or is at the maximum value 521. The second interval 512, or 0.001 second half of such cycle, is defined by the time period during which the RF signal approaches or is at the minimum value 522. Due to operational constraints of the particular PECVD equipment, the RF signal may be "stepped" higher or lower to reach the maximum/minimum values during the transition between successive intervals, as shown in FIG. 5. The process continues, with repeating first and second intervals, until the desired thickness of the first silicon nitride layer 125 is achieved. In one embodiment, the process is continued until the first silicon nitride layer 125 is at least about 50 Å thick at the thinnest portion along the upper regions 132 (as measured from the upper surface 123). In another embodiment, the process is continued until the first silicon nitride layer 125 is at most about 300 Å thick at the thickest portion along the lower regions 131 (as measured from the substrate 101).

Further illustrated in FIG. 5 are the relative flow rates of the silicon providing species 503 and the nitrogen-providing species 502. As shown therein, $SiH_4$ is provided at a flowrate of about 200 standard cubic centimeters per minute (sccm). Typically, the flowrate thereof is provided from about 150 sccm and 250 sccm. As further shown, $NH_3$ is provided at a flowrate of about 1750 sccm. Typically, the flowrate thereof is provided from about 1500 sccm to about 2150 sccm. Further, supplemental nitrogen ($N_2$) may be provided to achieve a desired pressure within the PECVD unit. As such, the flow rate of the nitrogen providing species is maintained constant throughout the operation of the PECVD process at a rate that is substantially higher than the flow rate of the silicon-providing species (which is also maintained constant throughout the operation of the PECVD process).

The varying thickness of the first silicon nitride layer 125, as described above, has the effect of "smoothing out" or minimizing the high aspect ratio features of the semiconductor device. That is, by depositing the layer 125 to a greater thickness in the lower regions 131 as compared to the upper regions 132, the "effective" aspect ratio of the semiconductor device after deposition of the first layer 125 is substantially reduced. For example, as shown in FIG. 2, the ratio of the distance 153 between the surface of the lowest point of the first layer 125 surface and the highest point of the first layer 125 surface and the distance 154 between devices 100*a*, 100*b* after deposition of the first layer 125 is substantially less than the aspect ratio 151:152 as described above.

With reference now to FIG. 3, after the deposition of the first silicon nitride layer 125, a second layer of silicon nitride 126 is deposited using convention deposition processes, such as CVD, LPCVD, conventional PECVD, etc. Because the effective aspect ratio of the semiconductor device above the first silicon nitride layer 125 is now substantially reduced, it is possible to use conventional deposition processes to complete the remainder of the isolation layer between devices without forming voids or seams. Thus, the second silicon nitride layer 126 may be deposited at a deposition rate that is greater than the deposition rate of the first silicon nitride layer 125. This "combined" silicon nitride isolation layer 127 is thus completed upon the deposition of the second silicon nitride layer 126 to a height 155 above the substrate 101 that is conventional for such isolation layers. In one example, as noted above, layer 125 may be provided to a thickness from about 50 Å to about 300 Å. Layer 126 may be provided to a thickness from about 500 Å to about 1000 Å.

As such, the present disclosure describes a PECVD process wherein a first silicon nitride layer is deposited by alternating intervals of radical/ionic species generation and surface reaction. The radical/ionic species generation intervals cause etching via chemical sputtering, wherein such etching occurs at a greater rate in upper regions of the device as compared to lower regions. The surface reaction intervals allow for deposition of the film layer along the surface of the device, wherein the flow rate of silicon-providing species as compared to nitrogen-providing species is relatively low so as to allow for substantial equal rates of deposition along all regions of the semiconductor device during such surface reaction intervals. By using this cyclic PECVD process to form a first silicon nitride layer, in conjunction with conventional deposition techniques to form a second silicon nitride layer over the first silicon nitride layer, a combined silicon nitride layer can be formed over high aspect ratio features that avoids the formation of voids and seams, while still allowing for a relatively high throughput. That is, the first layer acts as a conformal layer to round off any irregular regions and fill in locations that are hard to reach/fill (i.e., the regions 161, 162). The second layer acts to fill in the remaining height for any requirements such as subsequent chemical mechanical planarization (CMP) or etching processes, as may be required to complete the fabrication of the integrated circuit.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating an integrated circuit comprising the steps of:
provic a semiconductor substrate comprising a semiconductor device disposed thereon;
depositing a first silicon nitride layer over the semiconductor substrate and over the semiconductor device using a first deposition process, wherein the first deposition process is a plasma-enhance chemical vapor deposition (PECVD) process that operates over a plurality of cycles, each cycle having a first time interval and a second time interval, the PECVD process comprising the steps of:
generating a plasma with a power source during the first time interval, the plasma comprising reactive ionic and radical species of a silicon-providing gas and a nitrogen-providing gas, wherein the generating the plasma causes etching via sputtering of the first silicon nitride layer at an upper portion of the first silicon nitride layer over the semiconductor device at a first rate, wherein the generating the plasma causes etching via sputtering of the first silicon nitride layer an a lower portion of the first silicon nitride layer over the semiconductor substrate at a second rate, the first rate being relatively faster than the second rate; and
discontinuing generating the plasma during the second time interval immediately subsequent to the first time interval, wherein, during the second time interval, the first silicon nitride layer forms at a substantially equal rate at the upper portion of the first silicon nitride layer over the semiconductor device and at the lower portion of the first silicon nitride layer over the semiconductor substrate, wherein operating the PECVD process over the plurality of cycles causes the first silicon nitride layer to form at a greater thickness at the lower portion of the first silicon nitride layer over the semiconductor substrate as compared to the upper portion of the first silicon nitride layer over the semiconductor device; and
depositing a second silicon nitride layer over the first silicon nitride layer after the plurality of cycles.

2. The method of claim 1, wherein providing the semiconductor substrate comprises providing the semiconductor substrate with the semiconductor device having an aspect ratio of about 1.0 or greater.

3. The method of claim 2, wherein providing the semiconductor substrate comprises providing the semiconductor substrate with a transistor device disposed thereon.

4. The method of claim 1, wherein depositing the first silicon nitride layer comprises depositing the first silicon nitride layer to a thickness that ranges within about 50 Å to about 300 Å along a length of the first silicon nitride layer.

5. The method of claim 1, wherein depositing the second silicon nitride layer comprises depositing the second silicon nitride layer to a thickness from about 500 Å to about 1000 Å.

6. The method of claim 1, wherein depositing the second silicon nitride layer comprises depositing the second silicon nitride layer using PECVD, chemical vapor deposition (CVD), or low pressure chemical vapor deposition (LPCVD).

7. The method of claim 6, further comprising etching or planarizing the second silicon nitride layer.

8. The method of claim 1, wherein depositing the second silicon nitride layer comprises deposition the second silicon nitride layer in direct and abutting contact with the first silicon nitride layer so as to form a continuous silicon nitride layer.

9. A method of fabricating an integrated circuit comprising the steps of:
providing a semiconductor substrate comprising first and second semiconductor devices disposed thereon;
depositing a first silicon nitride layer over the semiconductor substrate and over the first and second semiconductor device using a first deposition process, wherein the first deposition process is a plasma-enhance chemical vapor deposition (PECVD) process that comprises the steps of:
generating a plasma with a power source during a first time interval, the plasma comprising reactive ionic and radical species of a silicon-providing gas and a nitrogen-providing gas, wherein the generating the plasma causes etching via sputtering of the first silicon nitride layer at an upper portion of the first silicon nitride layer over the semiconductor devices at a first rate, wherein the generating the plasma causes etching via sputtering of the first silicon nitride layer an a lower portion of the first silicon nitride layer over the semiconductor substrate at a second rate, the first rate being relatively faster than the second rate; and
discontinuing generating the plasma during a second time interval immediately subsequent to the first time interval, wherein, during the second time interval, the first silicon nitride layer forms at a substantially equal rate at the upper portion of the first silicon nitride layer over the semiconductor devices and at the lower portion of the first silicon nitride layer over the semiconductor substrate, wherein operating the PECVD process over the plurality of cycles causes the first silicon nitride layer to form at a greater thickness at the lower portion of the first silicon nitride layer over the semiconductor substrate as compared to the upper portion of the first silicon nitride layer over the semiconductor devices,
wherein the steps of generating the plasma and discontinuing generating the plasma are performed in a cyclic manner until the first silicon nitride layer is at least about 50 Å thick as measured from an upper surface of the first and second semiconductor; and
depositing a second silicon nitride layer over the first silicon nitride layer and in direct and abutting contact with the first silicon nitride layer so as to form a continuous silicon nitride layer.

10. The method of claim 9, wherein depositing the first silicon nitride layer comprises depositing the first silicon nitride layer with a first thickness between the first and second semiconductor devices and a second thickness above the first and second semiconductor devices.

11. The method of claim 10, wherein depositing the first silicon nitride layer comprises depositing a silicon nitride layer such that the first thickness is greater than the second thickness.

12. The method of claim 11, further comprising depositing the first silicon nitride layer with a third thickness along sidewall spacer portions of the first and second semiconductor devices, wherein the third thickness is less than the first thickness but greater than the second thickness.

13. The method of claim 9, wherein depositing the first silicon nitride layer with a variable thickness further comprises comprising a feed source of the silicon-providing gas and the nitrogen-providing gas, wherein the nitrogen-providing gas is provided at a flowrate that is greater than a flowrate of the silicon-providing gas.

14. The method of claim 9, wherein depositing the second silicon nitride layer is performed at a deposition rate that is greater than a deposition rate of depositing the first silicon nitride layer.

15. A method of fabricating an integrated circuit comprising the steps of:
   providing a semiconductor substrate comprising a semiconductor device disposed thereon;
   depositing a first silicon nitride layer over the semiconductor substrate and over the semiconductor device using a first deposition process, wherein the first deposition process is a plasma-enhance chemical vapor deposition (PECVD) process that comprises the steps of:
      generating a plasma by applying radio frequency power source to a mixture of silicon-providing gas and a nitrogen-providing gasses during a first time interval, the plasma comprising reactive ionic and radical species of the silicon-providing gas and the nitrogen-providing gas, wherein a flowrate of the silicon-providing gas is between about 150 standard cubic centimeters per minute (sccm) and about 250 sccm, and wherein a flowrate of the nitrogen-providing gas is between about 1500 sccm and about 2150 sccm, wherein the generating the plasma causes etching via sputtering of the first silicon nitride layer at an upper portion of the first silicon nitride layer over the semiconductor device at a first rate, wherein the generating the plasma causes etching via sputtering of the first silicon nitride layer an a lower portion of the first silicon nitride layer over the semiconductor substrate at a second rate, the first rate being relatively faster than the second rate;
      discontinuing generating the plasma by ceasing application of the radio frequency power source during a second time interval immediately subsequent to the first time interval, wherein, during the second time interval, the first silicon nitride layer forms at a substantially equal rate at the upper portion of the first silicon nitride layer over the semiconductor device and at the lower portion of the first silicon nitride layer over the semiconductor substrate, wherein operating the PECVD process over the plurality of cycles causes the first silicon nitride layer to form at a greater thickness at the lower portion of the first silicon nitride layer over the semiconductor substrate as compared to the upper portion of the first silicon nitride layer over the semiconductor device;
      generating a plasma by re-applying the radio frequency power source during a third time interval immediately subsequent to the second time interval,
      wherein the flowrate of the silicon-providing gas and the flowrate of the nitrogen-providing gas are both maintained constant during the first, second, and third time intervals; and
   depositing a second silicon nitride layer over the first silicon nitride layer and in direct and abutting contact with the first silicon nitride layer so as to form a continuous silicon nitride layer.

16. The method of claim 15, wherein generating the plasma with the radio frequency power source comprises generating the plasma with a radio frequency power source having a power between about 100 hz and about 1000 hz.

17. The method of claim 15, wherein generating the plasma by applying the radio frequency power source during the first time interval comprises generating the plasma for a time period of about 0.0005 second to about 0.005 second.

18. The method of claim 17, wherein discontinuing generating the plasma during the second time interval comprises discontinuing generating the plasma for a time period of about 0.0005 second to about 0.005 second.

19. The method of claim 18, wherein generating the plasma by re-applying the radio frequency power source during the third time interval comprises generating the plasma for a time period of about 0.0005 second to about 0.005 second.

* * * * *